United States Patent
Miyamoto et al.

(10) Patent No.: US 9,520,476 B2
(45) Date of Patent: Dec. 13, 2016

(54) SEMICONDUCTOR DEVICE AND METHOD FOR PRODUCING SAME

(71) Applicant: Sharp Kabushiki Kaisha, Osaka-shi, Osaka (JP)

(72) Inventors: Tadayoshi Miyamoto, Osaka (JP); Kazuatsu Ito, Osaka (JP); Shigeyasu Mori, Osaka (JP); Mitsunobu Miyamoto, Osaka (JP); Yasuyuki Ogawa, Osaka (JP); Makoto Nakazawa, Osaka (JP); Seiichi Uchida, Osaka (JP); Takuya Matsuo, Osaka (JP)

(73) Assignee: Sharp kabushiki Kaisha, Osaka (JP)

( * ) Notice: Subject to any disclaimer, the term of this patent is extended or adjusted under 35 U.S.C. 154(b) by 0 days.

(21) Appl. No.: 14/375,912

(22) PCT Filed: Jan. 24, 2013

(86) PCT No.: PCT/JP2013/051415
§ 371 (c)(1),
(2) Date: Jul. 31, 2014

(87) PCT Pub. No.: WO2013/115050
PCT Pub. Date: Aug. 8, 2013

(65) Prior Publication Data
US 2014/0361295 A1    Dec. 11, 2014

(30) Foreign Application Priority Data
Jan. 31, 2012    (JP) ................................ 2012-018752

(51) Int. Cl.
*H01L 29/49*    (2006.01)
*H01L 27/12*    (2006.01)
(Continued)

(52) U.S. Cl.
CPC ......... *H01L 29/4908* (2013.01); *H01L 21/441* (2013.01); *H01L 27/127* (2013.01);
(Continued)

(58) Field of Classification Search
CPC ........... H01L 29/78606; H01L 29/7869; H01L 29/66969; H01L 27/1225; H01L 27/127
(Continued)

(56) References Cited

U.S. PATENT DOCUMENTS

2010/0159639 A1*    6/2010    Sakata .............. H01L 21/02565
                                                          438/104
2011/0050551 A1    3/2011    Ota et al.
(Continued)

FOREIGN PATENT DOCUMENTS

CN    102122672 A    7/2011
JP    2011-053443 A    3/2011
(Continued)

OTHER PUBLICATIONS

Official Communication issued in International Patent Application No. PCT/JP2013/051415, mailed on Apr. 16, 2013.

*Primary Examiner* — Cuong Q Nguyen
*Assistant Examiner* — Tong-Ho Kim
(74) *Attorney, Agent, or Firm* — Keating & Bennett, LLP

(57) ABSTRACT

A semiconductor device (100A) includes a substrate (2), an oxide semiconductor layer (5) formed on the substrate (2), source and drain electrodes (6s, 6d) electrically connected to the oxide semiconductor layer (5), a first transparent electrode (7) electrically connected to the drain electrode (6d), a dielectric layer (8) formed on the source and drain electrodes (6s, 6d), and a second transparent electrode (9) formed on the dielectric layer (8). The upper and/or lower surface(s) of the first transparent electrode (7) contacts with a reducing insulating layer (8a) with the property of reduc-
(Continued)

ing an oxide semiconductor included in the oxide semiconductor layer (5). The second transparent electrode (9) overlaps at least partially with the first transparent electrode (7) via the dielectric layer (8). The oxide semiconductor layer (5) and the first transparent electrode (7) are formed out of the same oxide film.

14 Claims, 6 Drawing Sheets

(51) Int. Cl.
      *H01L 21/441*     (2006.01)
      *H01L 29/786*     (2006.01)
      *H01L 29/66*       (2006.01)
      *H01L 27/32*       (2006.01)

(52) U.S. Cl.
    CPC .... *H01L 27/1225* (2013.01); *H01L 29/66969* (2013.01); *H01L 29/7869* (2013.01); *H01L 29/78606* (2013.01); *H01L 27/3262* (2013.01)

(58) Field of Classification Search
    USPC .............................................. 257/43; 438/104
    See application file for complete search history.

(56) References Cited

U.S. PATENT DOCUMENTS

2012/0108018 A1*   5/2012  Okabe ................. H01L 27/1225
                                                                           438/158
2012/0138922 A1    6/2012  Yamazaki et al.

FOREIGN PATENT DOCUMENTS

JP         2011-091279 A     5/2011
JP         2012-134475 A     7/2012

* cited by examiner (a)

(b)

(c)

(a)

(b)

(a)

(b)

(c)

(d)

(e)

(a)

(b)

SEMICONDUCTOR DEVICE AND METHOD FOR PRODUCING SAME

TECHNICAL FIELD

The present invention relates to a semiconductor device which has been formed using an oxide semiconductor and a method for fabricating such a device, and more particularly relates to an active-matrix substrate for use in a liquid crystal display device or an organic EL display device and a method for fabricating such a substrate. In this description, the "semiconductor devices" include an active-matrix substrate and a display device which uses the active-matrix substrate.

BACKGROUND ART

An active-matrix substrate for use in a liquid crystal display device and other devices includes switching elements such as thin-film transistors (which will be simply referred to herein as "TFTs"), each of which is provided for an associated one of pixels. An active-matrix substrate including TFTs as switching elements is called a "TFT substrate".

As for TFTs, a TFT which uses an amorphous silicon film as its active layer (and will be referred to herein as an "amorphous silicon TFT") and a TFT which uses a polysilicon film as its active layer (and will be referred to herein as a "polysilicon TFT") have been used extensively.

Recently, people have proposed that an oxide semiconductor be used as a material for the active layer of a TFT instead of amorphous silicon or polysilicon. Such a TFT will be referred to herein as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film.

Patent Document No. 1 discloses a method for fabricating a TFT substrate including oxide semiconductor TFTs. According to the method disclosed in Patent Document No. 1, a TFT substrate can be fabricated in a reduced number of manufacturing process steps by forming a pixel electrode with the resistance of the oxide semiconductor layer locally decreased.

Recently, as the definition of liquid crystal display devices and other devices has become higher and higher, a decrease in pixel aperture ratio has become an increasingly serious problem. In this description, the "pixel aperture ratio" refers herein to the ratio of the combined area of pixels (e.g., the combined area of regions which transmit light that contributes to a display operation in a transmissive liquid crystal display device) to the overall display area. In the following description, the "pixel aperture ratio" will be simply referred to herein as an "aperture ratio".

Among other things, a medium to small sized transmissive liquid crystal display device to be used in a mobile electronic device has so small a display area that each of its pixels naturally has a very small area and the aperture ratio will decrease particularly significantly when the definition is increased. On top of that, if the aperture ratio of a liquid crystal display device to be used in a mobile electronic device decreases, the luminance of the backlight needs to be increased to achieve an intended brightness, thus causing an increase in power dissipation, too.

To achieve a high aperture ratio, the combined area occupied by a TFT, a storage capacitor, and other elements of a non-transparent material in each pixel may be decreased. However, naturally, the TFT and the storage capacitor should have their minimum required size to perform their function. When oxide semiconductor TFTs are used as TFTs, the TFTs can have a smaller size than when amorphous silicon TFTs are used, which is advantageous. It should be noted that in order to maintain a voltage that has been applied to the liquid crystal layer of a pixel (which is called a "liquid crystal capacitor" electrically), the "storage capacitor" is provided electrically in parallel with the liquid crystal capacitor. In general, at least a portion of the storage capacitor is arranged so as to overlap with the pixel.

CITATION LIST

Patent Literature

Patent Document No. 1: Japanese Laid-Open Patent Publication No. 2011-91279

SUMMARY OF INVENTION

Technical Problem

However, demands for increased aperture ratios are too huge to satisfy just by using oxide semiconductor TFTs. Meanwhile, as the prices of display devices have become lower and lower year after year, development of a technology for manufacturing high-aperture-ratio display devices at a lower cost is awaited.

Thus, a primary object of an embodiment of the present invention is to provide a TFT substrate which can be fabricated by a simpler process and which can contribute to realizing a display device with higher definition and a higher aperture ratio than conventional ones and also provide a method for fabricating such a TFT substrate.

Solution to Problem

A semiconductor device according to an embodiment of the present invention includes: a substrate; a gate electrode formed on the substrate; a gate insulating layer formed over the gate electrode; an oxide semiconductor layer formed on the gate insulating layer; source and drain electrodes electrically connected to the oxide semiconductor layer; a first transparent electrode electrically connected to the drain electrode; a dielectric layer formed over the source and drain electrodes; and a second transparent electrode formed on the dielectric layer. At least a portion of the second transparent electrode overlaps with the first transparent electrode with the dielectric layer interposed between them. At least one of upper and lower surfaces of the first transparent electrode contacts with a reducing insulating layer which has a property of reducing an oxide semiconductor included in the oxide semiconductor layer. The reducing insulating layer does not contact with a channel region of the oxide semiconductor layer. And the oxide semiconductor layer and the first transparent electrode are formed out of the same oxide film.

In one embodiment, the dielectric layer includes the reducing insulating layer and an oxide insulating layer which contacts with the channel region of the oxide semiconductor layer.

In one embodiment, the gate insulating layer includes the reducing insulating layer and an oxide insulating layer which contacts with a lower surface of the oxide semiconductor layer.

In one embodiment, the drain electrode is formed on the first transparent electrode, and the first transparent electrode contacts directly with the drain electrode.

In one embodiment, when viewed along a normal to the substrate, an end portion of the reducing insulating layer overlaps with the drain electrode.

In one embodiment, the oxide film includes In, Ga and Zn.

In one embodiment, the oxide semiconductor layer includes an In—Ga—Zn—O based semiconductor.

A method for fabricating a semiconductor device according to an embodiment of the present invention includes the steps of: (a) providing a substrate; (b) forming a gate electrode and a gate insulating layer on the substrate; (c) forming an oxide semiconductor film on the gate insulating layer; (d) forming source and drain electrodes on the oxide semiconductor film; (e) forming a dielectric layer over the source and drain electrodes; and (f) forming, either before or after the step (c), a reducing insulating layer which contacts with a portion of the oxide semiconductor film and which has a property of reducing an oxide semiconductor included in the oxide semiconductor film, thereby turning a portion of the oxide semiconductor film which contacts with the reducing insulating layer into a first transparent electrode and also turning the rest of the oxide semiconductor film which has not been reduced into an oxide semiconductor layer; and (g) forming a second transparent electrode on the dielectric layer, at least a portion of the second transparent electrode overlapping with the first transparent electrode with the dielectric layer interposed between them.

In one embodiment, the step (f) is included in the step (b).

In one embodiment, the step (f) is included in the step (e).

In one embodiment, at least one of the dielectric layer and the gate insulating layer includes an oxide insulating layer, and the oxide insulating layer contacts with the oxide semiconductor layer.

In one embodiment, when viewed along a normal to the substrate, an end portion of the reducing insulating layer overlaps with the drain electrode.

In one embodiment, the oxide semiconductor film includes an In—Ga—Zn—O based semiconductor.

Advantageous Effects of Invention

An embodiment of the present invention provides a TFT substrate which can be fabricated by a simpler process and which can contribute to realizing a display device with higher definition and a higher aperture ratio than conventional ones and also provides a method for fabricating such a TFT substrate.

DESCRIPTION OF EMBODIMENTS

Figure 1:
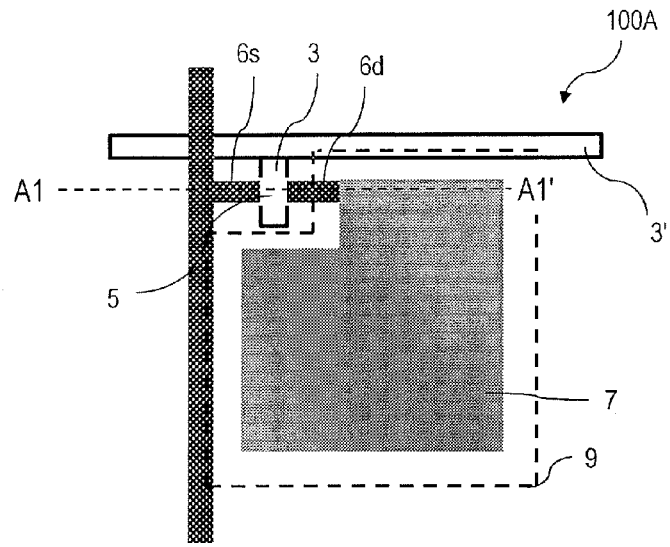
FIG. 1 (a) is a schematic plan view illustrating a TFT substrate 100A according to an embodiment of the present invention. (b) is a schematic cross-sectional view of the TFT substrate 100A as viewed on the plane A1-A1' shown in (a). And (c) is a schematic cross-sectional view of a liquid crystal display device 500 including the TFT substrate 100A.
Figure 1:
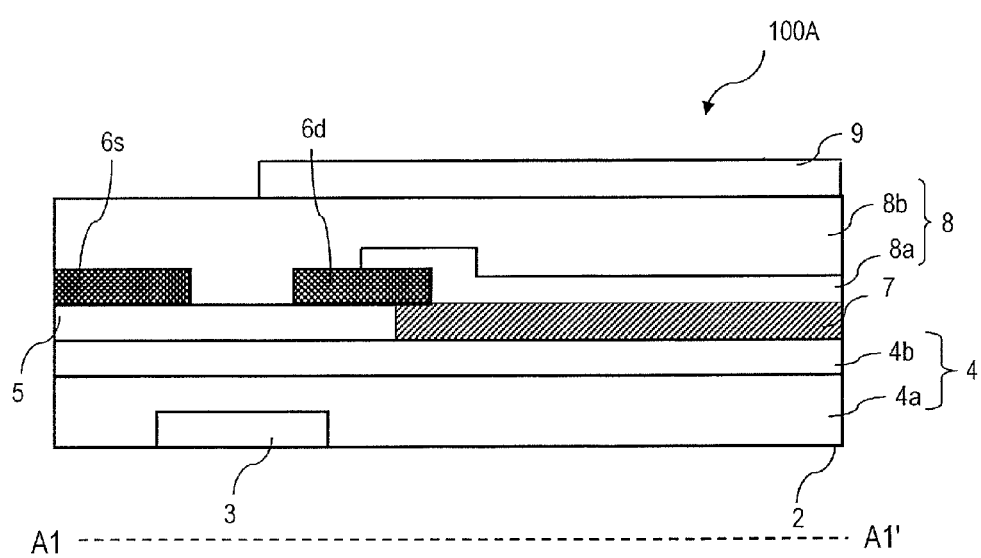
Figure 1:
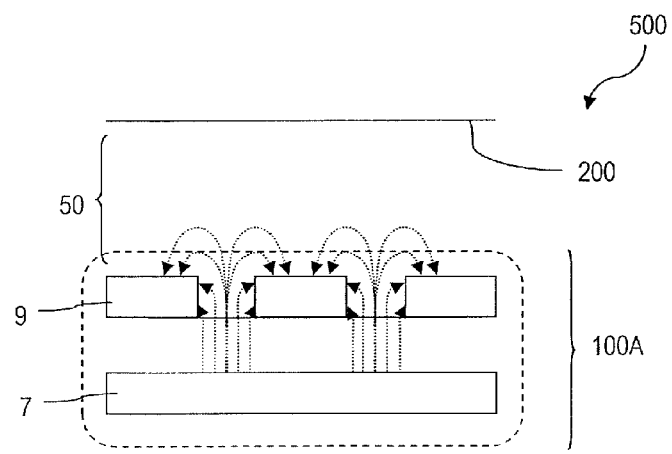

Hereinafter, a semiconductor device according to an embodiment of the present invention will be described with reference to the accompanying drawings. A semiconductor device according to this embodiment includes a thin-film transistor which has an active layer made of an oxide semiconductor (and which will be referred to herein as an "oxide semiconductor TFT"). A semiconductor device according to this embodiment just needs to include an oxide semiconductor TFT and may be implemented broadly as an active-matrix substrate or any of various kinds of display devices and electronic devices.

In the following description, a semiconductor device according to an embodiment of the present invention will be described as being applied to an oxide semiconductor TFT for use in a liquid crystal display device.

FIG. 1(a) is a schematic plan view illustrating a TFT substrate 100A according to this embodiment. FIG. 1(b) is a schematic cross-sectional view of the semiconductor device (TFT substrate) 100A as viewed on the plane A1-A1' shown in FIG. 1(a). And FIG. 1(c) is a schematic cross-sectional view of a liquid crystal display device 500 including the TFT substrate 100A. In FIG. 1(c), the dotted arrows indicate the directions of an electric field.

This TFT substrate 100A includes: a substrate 2; a gate electrode 3 which has been formed on the substrate 2; a gate insulating layer 4 which has been formed over the gate electrode 3; an oxide semiconductor layer 5 which has been formed on the gate insulating layer 4; an oxide insulating layer which contacts with the channel region of the oxide semiconductor layer 5; source and drain electrodes 6s, 6d which are electrically connected to the oxide semiconductor layer 5; a first transparent electrode 7 which is electrically connected to the drain electrode 6d; a dielectric layer 8 which has been formed over the source and drain electrodes 6s, 6d; and a second transparent electrode 9 which has been formed on the dielectric layer 8. At least a portion of the second transparent electrode 9 overlaps with the first transparent electrode 7 with the dielectric layer 8 interposed between them. At least one of the upper and lower surfaces of the first transparent electrode 7 contacts with a reducing insulating layer 8a with the property of reducing an oxide semiconductor included in the oxide semiconductor layer 5. The oxide semiconductor layer 5 and the first transparent electrode 7 are formed out of the same oxide film. And the reducing insulating layer 8a does not contact with a channel region of the oxide semiconductor layer 5.

In this TFT substrate 100A, at least a portion of the second transparent electrode 9 overlaps with the first transparent electrode 7 with the dielectric layer 8 interposed between them, thereby forming a storage capacitor there. That is why the storage capacitor this TFT substrate 100A has is transparent (i.e., transmits visible light), and therefore, does not decrease the aperture ratio. Consequently, this TFT substrate 100A can have a higher aperture ratio than a TFT substrate, of which the storage capacitor includes a non-transparent electrode that has been formed out of a metal film (i.e., either a gate metal layer or a source metal layer) as in a conventional structure. In addition, since the aperture ratio is not decreased by the storage capacitor, the capacitance value of the storage capacitor (i.e., the area of the storage capacitor) can be increased as needed, which is also beneficial.

Furthermore, it is preferred that the drain electrode 6d be formed on, and contact directly with, the first transparent electrode 7. By adopting such a structure, the first transparent electrode 7 can be extended to reach approximately an end portion of the drain electrode 6d. As a result, this TFT substrate 100A can have a higher aperture ratio than the TFT substrate disclosed in Patent Document No. 1.

In this TFT substrate 100A, the dielectric layer 8 includes a reducing insulating layer 8a and an insulating protective layer 8b. The reducing insulating layer 8a has been formed over the first transparent electrode 7, and the insulating protective layer 8b has been formed over the reducing insulating layer 8a.

Hereinafter, the respective components of this TFT substrate 100A will be described in detail one by one.

The substrate 2 is typically a transparent substrate and may be a glass substrate, for example, but may also be a plastic substrate. Examples of the plastic substrates include a substrate made of either a thermosetting resin or a thermoplastic resin and a composite substrate made of these resins and an inorganic fiber (such as glass fiber or a non-woven fabric of glass fiber). A resin material with thermal resistance may be polyethylene terephthalate (PET), polyethylene naphthalate (PEN), polyether sulfone (PES), an acrylic resin, or a polyimide resin, for example. Also, when used in a reflective liquid crystal display device, the substrate 2 may also be a silicon substrate.

The gate electrode 3 is electrically connected to a gate line 3'. The gate electrode 3 and the gate line 3' may have a multilayer structure, of which the upper layer is a W (tungsten) layer and the lower layer is a TaN (tantalum nitride) layer, for example. Alternatively, the gate electrode 3 and the gate line 3' may also have a multilayer structure consisting of Mo (molybdenum), Al (aluminum) and Mo layers or may even have a single-layer structure, a double layer structure, or a multilayer structure consisting of four or more layers. Still alternatively, the gate electrode 3a may be made of an element selected from the group consisting of Cu (copper), Al, Cr (chromium), Ta (tantalum), Ti (titanium), Mo and w or an alloy or metal nitride which is comprised mostly of any of these elements. The gate electrode 3 may have a thickness of approximately 420 nm, for example. The thickness of the gate electrode 3 suitably falls within the range of about 50 nm to about 600 nm, for example.

The gate insulating layer 4 includes a lower gate insulating layer 4a and an upper gate insulating layer 4b. The upper gate insulating layer 4b that contacts with the oxide semiconductor layer 5 suitably includes an oxide insulating layer. If the oxide insulating layer directly contacts with the oxide semiconductor layer 5, oxygen included in the oxide insulating layer will be supplied to the oxide semiconductor layer 5, thus preventing oxygen deficiencies of the oxide semiconductor layer 5 from deteriorating the properties of the semiconductor. The upper gate insulating layer 4b may be an $SiO_2$ (silicon dioxide) layer, for example. The lower gate insulating layer 4a may be an $SiN_x$ (silicon nitride) layer, for example. In this embodiment, the lower gate insulating layer 4a may have a thickness of approximately 325 nm, the upper gate insulating layer 4b may have a thickness of approximately 50 nm, and the gate insulating layer 4 may have an overall thickness of approximately 375 nm, for example. Alternatively, the gate insulating layer 4 may also be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the gate insulating layer 4 suitably falls within the range of about 50 nm to about 600 nm. To prevent impurities from diffusing from the substrate 2, the lower gate insulating layer 4a is suitably made of $SiN_x$ or $SiN_xO_y$ (silicon oxynitride, where x>y). Moreover, to prevent the semiconductor properties of the oxide semiconductor layer 5 from deteriorating, the upper gate insulating layer 4b is suitably made of either $SiO_2$ or $SiO_xN_y$ (silicon nitride oxide, where x>y). Furthermore, to form a dense gate insulating layer 4 which causes little gate leakage current at low temperatures, the gate insulating layer 4 is suitably formed using a rare gas of Ar (argon), for example.

The oxide semiconductor layer 5 may include an In—Ga—Zn—O based semiconductor (which will be referred to herein as an "IGZO based semiconductor"), for example. In this case, the IGZO based semiconductor is a ternary oxide of In (indium), Ga (gallium) and Zn (zinc). The ratios (i.e., mole fractions) of In, Ga and Zn are not particularly limited. For example, In:Ga:Zn=2:2:1, In:Ga:Zn=1:1:1 or In:Ga:Zn=1:1:2 may be satisfied. The IGZO based semiconductor may be either amorphous or crystalline. If the IGZO based semiconductor is a crystalline one, a crystalline IGZO based semiconductor of which the c axis is substantially perpendicular to the layer plane is suitably used. The crystal structure of such an IGZO based semiconductor is disclosed, for example, in Japanese Laid-Open Patent Publication No. 2012-134475, the entire disclosure of which is hereby incorporated by reference.

The oxide semiconductor material that makes the oxide semiconductor layer 5 does not have to be an IGZO based semiconductor, but may also be a Zn—O based semiconductor (ZnO), an In—Zn—O based semiconductor (IZO™), a Zn—Ti—O based semiconductor (ZTO), a Cd—Ge—O based semiconductor, a Cd—Pb—O based semiconductor, CdO (cadmium oxide), an Mg—Zn—O based semiconductor, an In—Sn—Zn—O based semiconductor (such as $In_2O_3$—$SnO_2$—ZnO) or an In—Ga—Sn—O based semiconductor, for example. Furthermore, the oxide semiconductor layer 5 may also be ZnO in an amorphous state, a polycrystalline state, or a microcrystalline state (which is a mixture of amorphous and polycrystalline states) to which one or multiple dopant elements selected from the group consisting of Group I, Group XIII, Group XIV, Group XV and Group XVII elements have been added, or may even be ZnO to which no dopant elements have been added at all. If an amorphous oxide semiconductor layer is used as the oxide semiconductor layer 5, the semiconductor device can be fabricated at a low temperature and can achieve high mobility. The oxide semiconductor layer 5 may have a thickness of approximately 50 nm, for example. The thickness of the oxide semiconductor layer 5 suitably falls within the range of about 30 nm to about 100 nm, for example.

The source and drain electrodes 6s and 6d may have a multilayer structure comprised of Ti, Al and Ti layers, for example. Alternatively, the source and drain electrodes 6s and 6d may also have a multilayer structure comprised of Mo, Al and Mo layers or may even have a single-layer structure, a double layer structure or a multilayer structure consisting of four or more layers. Furthermore, the source and drain electrodes 6s and 6d may also be made of an element selected from the group consisting of Al, Cr, Ta, Ti, Mo and W, or an alloy or metal nitride comprised mostly of any of these elements. The source and drain electrodes 6s and 6d may have a thickness of approximately 350 nm, for example. The thicknesses of the source and drain electrodes 6s and 6d suitably fall within the range of about 50 nm to about 600 nm.

The dielectric layer 8 includes an insulating protective layer 8b, and is arranged between the first and second transparent electrodes 7 and 9 to form a storage capacitor there. If a storage capacitor is formed of those transparent electrodes 7 and 9 and the transparent dielectric layer 8 in this manner, a display panel with a high aperture ratio can be fabricated when this TFT substrate 100A is used to make a display panel.

Figure 2:
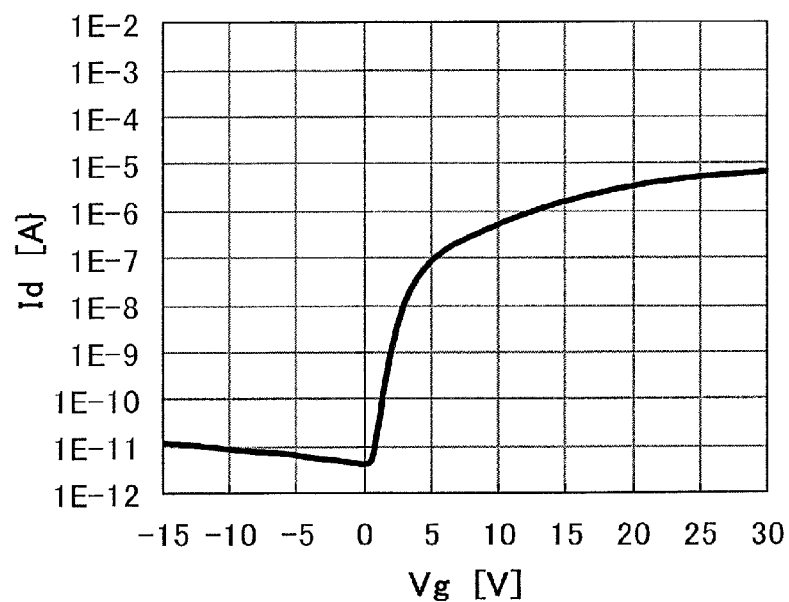
FIG. 2 (a) is a graph showing a gate voltage (Vg)-drain current (Id) curve of an oxide semiconductor TFT in which an oxide insulating layer contacts directly with an oxide semiconductor layer). (b) is a graph showing a gate voltage (Vg)-drain current (Id) curve of an oxide semiconductor TFT in which a reducing insulating layer 8a contacts directly with the oxide semiconductor layer.
Figure 2:
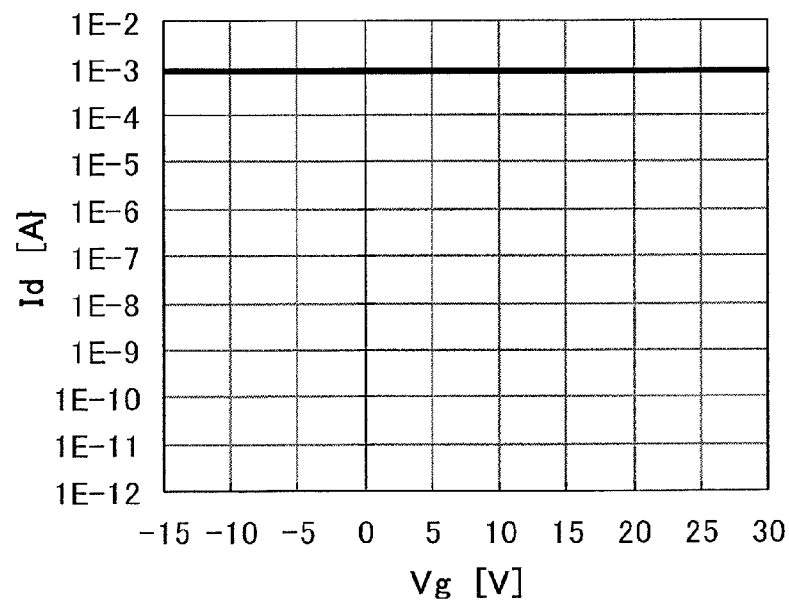

Next, the reducing insulating layer 8a will be described with reference to FIG. 2. When in contact with an oxide semiconductor layer, the reducing insulating layer 8a has the function of lowering its electrical resistance. FIG. 2(*a*) is a graph showing a gate voltage (Vg)-drain current (Id) curve of an oxide semiconductor TFT having a configuration in which an oxide insulating layer (of $SiO_2$, for example) has been formed so as to contact with the entire lower surface of an oxide semiconductor layer (active layer). On the other hand, FIG. 2(*b*) is a graph showing a gate voltage (Vg)-drain current (Id) curve of an oxide semiconductor TFT having a configuration in which a reducing insulating layer (of $SiN_x$, for example) has been formed so as to contact with the entire lower surface of an oxide semiconductor layer (active layer).

As can be seen from FIG. 2(*a*), an oxide semiconductor TFT in which an oxide insulating layer contacts directly with an oxide semiconductor layer has a good TFT characteristic.

On the other hand, as can be seen from FIG. 2(*b*), an oxide semiconductor TFT in which a reducing insulating layer contacts directly with an oxide semiconductor layer does not have a TFT characteristic, and the oxide semiconductor layer is turned into a conductor by the reducing insulating layer.

As can be seen from the foregoing description, if the reducing insulating layer 8a contacts with the oxide semiconductor layer, the electrical resistance of the oxide semiconductor layer decreases. This is probably because the reducing insulating layer 8a will include a lot of hydrogen and will reduce the oxide semiconductor layer 5 by contacting with the oxide semiconductor layer 5, thus lowering the resistance of the oxide semiconductor film. That is why if such a reducing insulating layer 8a is formed to directly contact with the oxide semiconductor layer 5, the resistance of the oxide semiconductor layer 5 can be lowered even without performing any special resistance lowering process (such as a hydrogen plasma treatment). In the manufacturing process of the TFT substrate 100A of this embodiment, if the reducing insulating layer 8a is arranged to contact with a portion of the oxide semiconductor film, an electrode can be formed with the resistance of the oxide semiconductor film lowered partially. On the other hand, the rest of the oxide semiconductor film, of which the resistance has not been lowered, can be used as an active layer for TFTs. Consequently, the manufacturing process can be simplified and the manufacturing cost can be cut down.

The reducing insulating layer 8a may be made of $SiN_x$, for example. The reducing insulating layer 8a may be deposited at a substrate temperature of about 100° C. to about 250° C. (e.g., at 220° C.) and with the flow rates adjusted so that the $SiH_4$—$NH_3$ mixed gas flow rate (in sscm) ratio (i.e., the ratio of the $SiH_4$ flow rate to the $NH_3$ flow rate) falls within the range of 4 to 20. The reducing insulating layer 8a may have a thickness of about 100 nm, for example. The thickness of the reducing insulating layer 8a suitably falls within the range of about 50 nm to about 300 nm.

The insulating protective layer 8b has been formed to contact with the channel region of the oxide semiconductor layer 5. The insulating protective layer 8b is suitably made of an insulating oxide (such as $SiO_2$). If the insulating protective layer 8b is made of an insulating oxide, it is possible to prevent the oxygen deficiencies of the oxide semiconductor layer 5 from deteriorating the semiconductor properties as described above. Alternatively, the insulating protective layer 8b may also be made of SiON (which may be either silicon oxynitride or silicon nitride oxide), $Al_2O_3$ or $Ta_2O_5$, for example. The insulating protective layer 8b may have a thickness of about 265 nm. The thickness of the insulating protective layer 8b suitably falls within the range of about 50 nm to about 300 nm, for example.

The first transparent electrode 7 may be a conductive layer including an In—Ga—Zn—O based oxide (which will be referred to herein as an "IGZO based oxide"), for example. The first transparent electrode 7 may have a thickness of about 50 nm, for example. The thickness of the first transparent electrode 7 suitably falls within the range of about 20 nm to about 200 nm, for example. As will be described in detail later, the first transparent electrode 7 and the oxide semiconductor layer 5 are formed out of the same transparent oxide film. If the first transparent electrode 7 and the oxide semiconductor layer 5 are formed out of the same oxide film, the manufacturing process can be simplified and the manufacturing cost can be cut down. As the oxide film, a film including an IGZO based oxide such as an IGZO based semiconductor film may be used, for example. As mentioned above, in this description, an IGZO based oxide with semiconductor properties will be referred to herein as an "IGZO based semiconductor".

The second transparent electrode 9 is formed out of a transparent conductive film (of ITO (indium tin oxide) or IZO, for example). The second transparent electrode 9 may have a thickness of about 100 nm, for example. The thickness of the second transparent electrode 9 suitably falls within the range of about 20 nm to about 200 nm, for example.

As shown in FIG. 1(*c*), the TFT substrate 100A may be used in a fringe field switching (FFS) mode liquid crystal display device 500, for example. In this case, the first transparent electrode 7 that forms the lower layer is used as a pixel electrode (to which a display signal voltage is applied) and the second transparent electrode 9 that forms the upper layer is used as a common electrode (to which either a common voltage or a counter voltage is applied). At least one slit is cut through the second transparent electrode 9. An FFS mode liquid crystal display device 500 with such a configuration is disclosed in Japanese Laid-Open Patent Publication No. 2011-53443, for example, the entire disclosure of which is hereby incorporated by reference.

This liquid crystal display device 500 includes a TFT substrate 100A, a counter substrate 200, and a liquid crystal layer 50 interposed between the TFT substrate 100A and the counter substrate 200. In this liquid crystal display device 500, no counter electrode such as a transparent electrode of ITO, for example, is arranged on the surface of the counter substrate 200 to face the liquid crystal layer 50. Instead, a display operation is carried out by controlling the alignments of liquid crystal molecules in the liquid crystal layer 50 with a lateral electric field which has been generated by the first and second transparent electrodes (i.e., the pixel electrode and the common electrode) 7 and 9 that have been formed on the TFT substrate 100A.

Figure 3:
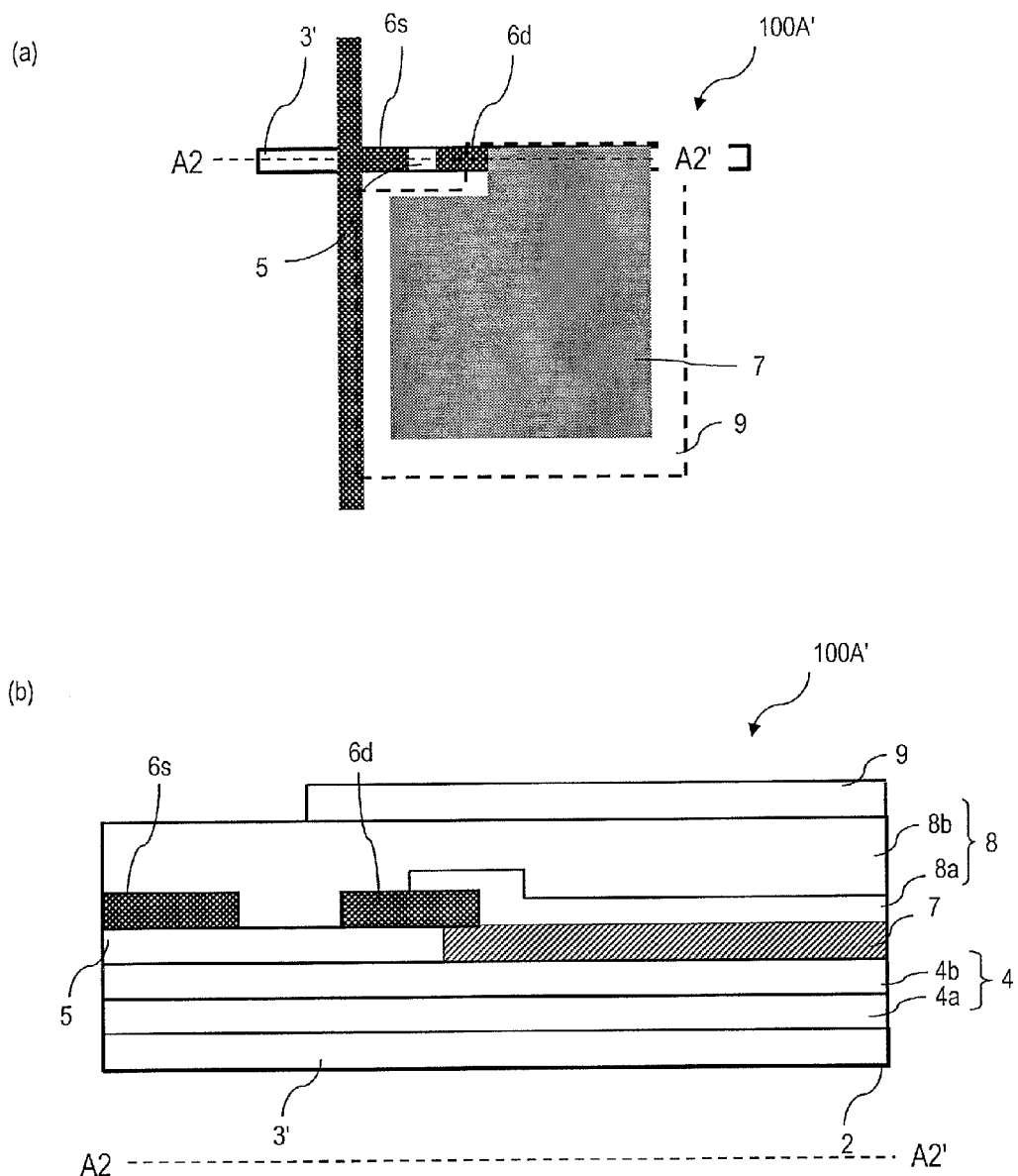
FIG. 3 (a) is a schematic plan view illustrating a TFT substrate 100A' as a modified example. (b) is a schematic cross-sectional view of the TFT substrate 100A' as viewed on the plane A2-A2' shown in (a).

The TFT substrate 100A may be modified into the TFT substrate 100A' shown in FIG. 3. FIG. 3(a) is a schematic plan view illustrating a TFT substrate 100A' as a modified example. FIG. 3(b) is a schematic cross-sectional view of the TFT substrate 100A' as viewed on the plane A2-A2' shown in FIG. 3(a).

The TFT substrate 100A' shown in FIGS. 3(a) and 3(b) includes an oxide semiconductor layer 5 which overlaps with a gate line 3' and has a structure in which when viewed along a normal to the substrate 2, the gate line 3' and the source and drain electrodes 6s, 6d overlap with each other, which is a difference from the TFT substrate 100A. In this TFT substrate 100A', the gate line 3' functions as a gate electrode 3. The TFT substrate 100A' can have an even higher aperture ratio than the TFT substrate 100A.

However, this TFT substrate 100A' has a higher gate-drain parasitic capacitance (Cgd) than the TFT substrate 100A, which is one of drawbacks of the TFT substrate 100A'. As is well known, if the gate-drain parasitic capacitance (Cgd) is large, then the feedthrough voltage rises. The feedthrough voltage would cause an image persistence phenomenon or flickers. To lower the feedthrough voltage, the ratio of the gate-drain parasitic capacitance (Cgd) to the overall capacitance of the pixel (i.e., liquid crystal capacitance Clc+ storage capacitance Cs+gate-drain parasitic capacitance Cgd) needs to be decreased. This TFT substrate 100A' has a transparent storage capacitor with a transparent electrode, and therefore, can have its capacitance value increased by increasing the area of the storage capacitor without causing a decrease in aperture ratio. That is to say, even by adopting such a structure in which the gate-drain parasitic capacitance (Cgd) becomes as high as in this TFT substrate 100A', the feedthrough voltage can be reduced sufficiently.

Moreover, if a pixel's overall capacitance is large, it means that a lot of electric charges are needed to apply a predetermined voltage to the pixel. This TFT substrate 100A' includes oxide semiconductor TFTs which have higher current supplying ability than conventional amorphous silicon TFTs. That is why the display quality will never be debased by an increase in the pixel's capacitance.

Next, it will be described how to fabricate the TFT substrate 100A.

A method for fabricating a semiconductor device 100A according to an embodiment of the present invention includes the steps of: (a) providing a substrate 2; (b) forming a gate electrode 3 and a gate insulating layer 4 on the substrate 2; (c) forming an oxide semiconductor film 5' on the gate insulating layer 4; (d) forming source and drain electrodes 6s, 6d on the oxide semiconductor film 5'; (e) forming a dielectric layer 8 over the source and drain electrodes 6s, 6d; (f) forming, either before or after the step (c), a reducing insulating layer 8a which contacts with a portion of the oxide semiconductor film 5' and which has the property of reducing an oxide semiconductor included in the oxide semiconductor film 5', thereby turning a portion of the oxide semiconductor film 5' which contacts with the reducing insulating layer 8a into a first transparent electrode 7 and also turning the rest of the oxide semiconductor film which has not been reduced into an oxide semiconductor layer 5; and (g) forming a second transparent electrode 9 on the dielectric layer 8, at least a portion of the second transparent electrode 7 overlapping with the first transparent electrode 7 with the dielectric layer 8 interposed between them.

Such a method for fabricating a semiconductor device is a simplified one, and therefore, can contribute to cutting down the manufacturing cost.

Figure 4:
FIG. 4 (a) through (e) are schematic cross-sectional views illustrating an exemplary manufacturing process for fabricating a TFT substrate 100A according to an embodiment of the present invention.
Figure 4:
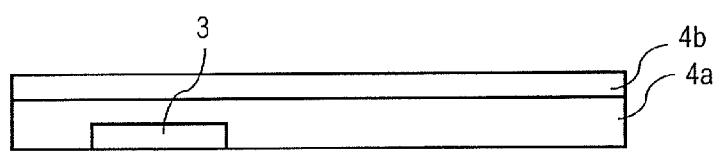
Figure 4:
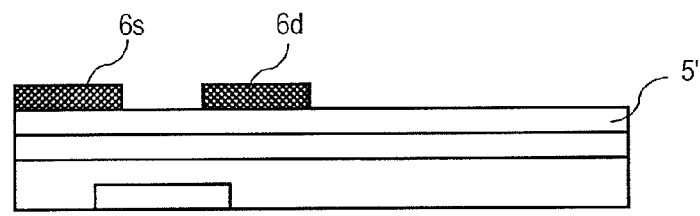
Figure 4:
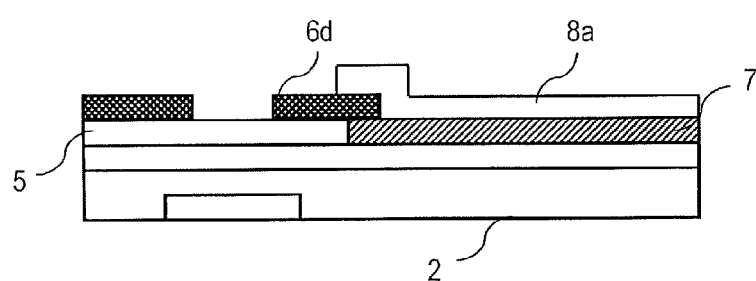
Figure 4:
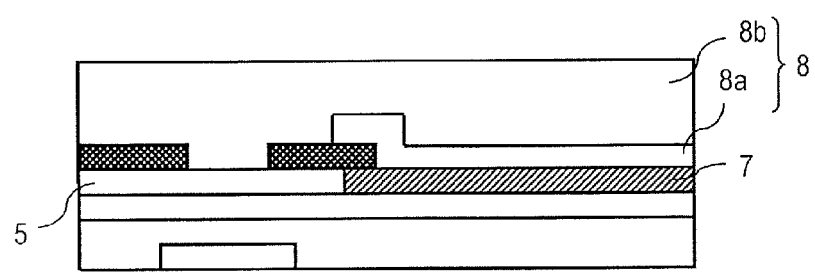

Hereinafter, an exemplary method for fabricating the TFT substrate 100A will be described in detail with reference to FIG. 4.

FIGS. 4(a) through 4(e) are schematic cross-sectional views illustrating an exemplary method for fabricating the TFT substrate 100A.

First of all, as shown in FIG. 4(a), a gate electrode 3 is formed on a substrate 2. As the substrate 2, a transparent insulating substrate such as a glass substrate, for example, may be used. The gate electrode 3 may be formed by depositing a conductive film on the substrate 2 by sputtering process and then patterning the conductive film by photolithographic process. In this example, a multilayer film with a double layer structure consisting of a TaN film (with a thickness of about 50 nm) and a W film (with a thickness of about 370 nm) that have been stacked one upon the other in this order on the substrate 2 is used as the conductive film. As this first conductive film, a single-layer film of Ti, Mo, Ta, W, Cu, Al or Cr, a multilayer film or alloy film including any of these elements in combination, or a metal nitride film thereof may be used.

Next, as shown in FIG. 4(b), a lower gate insulating layer 4a and an upper gate insulating layer 4b are formed by CVD (chemical vapor deposition) process to cover the gate electrode 3. In this example, the lower gate insulating layer 4a is formed out of an $SiN_x$ film (with a thickness of about 325 nm) and the upper gate insulating layer 4b is formed out of an $SiO_2$ film (with a thickness of about 50 nm). The upper gate insulating layer 4b may be made of $SiO_2$, $SiO_xN_y$ (silicon oxynitride, where x>y), $SiN_xO_y$ (silicon nitride oxide, where x>y), $Al_2O_3$, or $Ta_2O_5$, for example. The lower gate insulating layer 4a may be made of $SiN_x$, $SiO_2$, $SiO_xN_y$ (silicon oxynitride, where x>y), $SiN_xO_y$ (silicon nitride oxide, where x>y), $Al_2O_3$, or $Ta_2O_5$, for example.

Subsequently, as shown in FIG. 4(c), an oxide semiconductor film 5' is formed by sputtering process on the upper gate insulating layer 4b. As the oxide semiconductor film 5', an IGZO based semiconductor film may be used, for example. The oxide semiconductor film 5' may have a thickness of about 50 nm.

Thereafter, a conductive film (not shown) to be source and drain electrodes 6s and 6d is formed by sputtering process over the oxide semiconductor film 5'. Next, the conductive film and the oxide semiconductor film 5' are patterned simultaneously by photolithographic process using a halftone mask, dry etching process and asking process, thereby turning the oxide semiconductor film 5' into an intended shape and forming source and drain electrodes 6s and 6d. Since the source and drain electrodes 6s and 6d can be formed and the oxide semiconductor film 5' can be patterned in this manner using a single photomask, the manufacturing process can be simplified and the manufacturing cost can be cut down. The source and drain electrodes 6s and 6d may have a multilayer structure consisting of Ti, Al and Ti layers, for example. The lower Ti layer may have a thickness of about 50 nm, the Al layer may have a thickness of about 200 nm, and the upper Ti layer may have a thickness of about 100 nm.

Subsequently, as shown in FIG. 4(d), a reducing insulating layer 8a is formed by CVD and photolithographic processes so as not to cover the channel region of the oxide semiconductor film 5'. In this embodiment, the reducing insulating layer 8a is deposited under the condition including a substrate temperature of about 100° C. to about 250° C. (e.g., about 220° C.) and an $SiH_4/NH_3$ mixed gas flow rate ratio (i.e., the ratio of the $SiH_4$ flow rate to the $NH_3$ flow rate) of 4 to 20. When viewed along a normal to the substrate 2, an end portion of the reducing insulating layer 8a may overlap with the drain electrode 6d. If the reducing insulating layer 8a is formed in this manner, the first transparent electrode 7 (to be described later) can be formed to reach the vicinity of the end portion of the drain electrode 6d which is located opposite from the channel region. As a result, the aperture ratio of the pixel can be increased. The reducing insulating layer 8a may be made of $SiN_x$ and may have a thickness of about 100 nm.

A portion of the oxide semiconductor film 5' which contacts with the reducing insulating layer 8a is reduced by hydrogen, for example, included in the reducing insulating layer 8a, thereby forming a first transparent electrode 7. In addition, another portion of the oxide semiconductor film 5' which is located under the drain electrode 6d may also have its resistance lowered by that hydrogen diffusing and may form part of the first transparent electrode 7, too. Meanwhile, the rest of the oxide semiconductor film 5' which has not had its resistance lowered turns into an oxide semiconductor layer 5.

Next, as shown in FIG. 4(e), an insulating protective layer 8b is deposited by CVD process over the first transparent electrode 7 so as to contact with the channel region of the oxide semiconductor layer 5. In this embodiment, the reducing insulating layer 8a and the insulating protective layer 8b together form a dielectric layer 8. The insulating protective layer 8b may be made of $SiO_2$, for example. The insulating protective layer 8b may have a thickness of about 265 nm. A contact hole (not shown) has been cut through the insulating protective layer 8b by a known method. Optionally, after the insulating protective layer 8b has been formed, a heat treatment (annealing process) may be carried out at a temperature (of about 300° C., for example) that is equal to or higher than the deposition temperature at which the insulating protective layer 8b has been deposited. By conducting the heat treatment, hydrogen included in the reducing insulating layer 8a can be diffused through the oxide semiconductor film 5' and the electrical resistance of the first transparent electrode 7 can be further lowered.

Subsequently, as shown in FIG. 1(b), a transparent conductive film is deposited by sputtering process, for example, over the insulating protective layer 8b and then patterned, thereby forming a second transparent electrode 9. At least a portion of the second transparent electrode 9 overlaps with the first transparent electrode 7 with the dielectric layer 8 interposed between them. The second transparent electrode 9 may be made of ITO, for example, and may have a thickness of about 100 nm.

Although not shown, the transparent conductive film to be patterned into this second transparent electrode 9 may be used as not only a common electrode but also an extended line to be electrically connected to a source metal layer that has been formed out of the same conductive film as a source line (source bus line) or a gate metal layer that has been formed out of the same conductive film as a gate line (gate bus line). As a result, a TFT substrate including an integrated driver can be formed and a display device of high quality can be fabricated.

Figure 5:
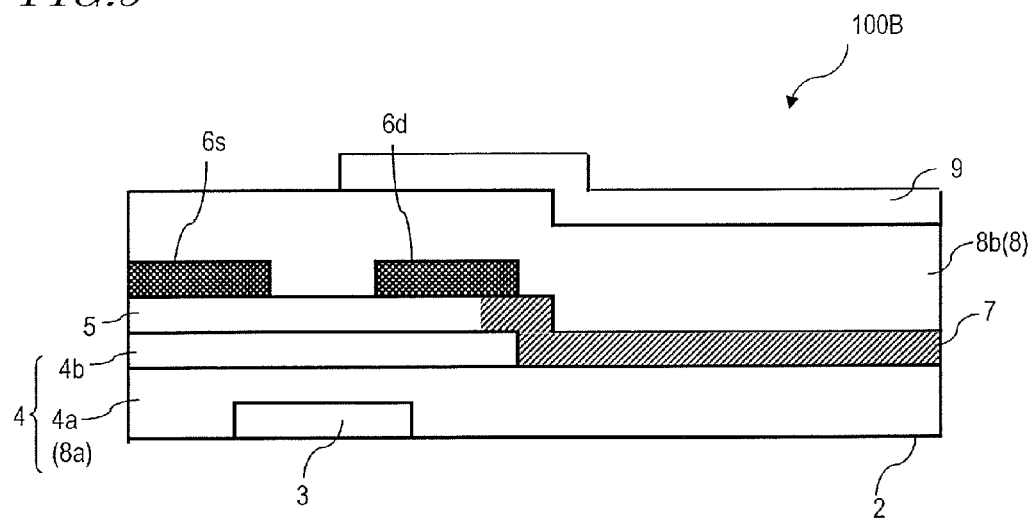
FIG. 5 A schematic cross-sectional view of a TFT substrate 100B according to another embodiment of the present invention.

Hereinafter, a TFT substrate 100B according to another embodiment of the present invention will be described with reference to FIG. 5, which is a schematic cross-sectional view of the TFT substrate 100B and which corresponds to the cross-sectional view of the TFT substrate 100A shown in FIG. 1(b). In FIG. 5, any component also included in the TFT substrate 100A and having substantially the same function as its counterpart is identified by the same reference numeral and its description will be omitted herein to avoid redundancies.

In the TFT substrate 100B shown in FIG. 5, the reducing insulating layer 8a of the TFT substrate 100A has not been formed over the first transparent electrode 7 and the first transparent electrode 7 contacts with the lower gate insulating layer 4a. In this TFT substrate 100B, instead of forming the reducing insulating layer 8a over the first transparent electrode 7, the lower gate insulating layer 4a which is located under the first transparent electrode 7 is made to function as the reducing insulating layer 8a and the lower gate insulating layer 4a is brought into contact with the first transparent electrode 7. That is why the lower gate insulating layer 4a is made of the material of the reducing insulating layer 8a and the oxide semiconductor layer 5 does not contact with the lower gate insulating layer 4a. In this TFT substrate 100B, the dielectric layer 8 includes an insulating protective layer 8b but does not include the reducing insulating layer 8a.

Figure 6:
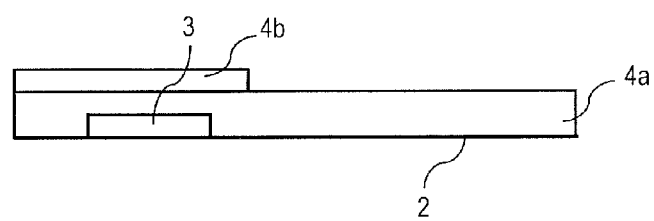
FIGS. 6 (a) and (b) are schematic cross-sectional views illustrating respective manufacturing process steps to fabricate the TFT substrate 100B according to the embodiment of the present invention.
Figure 6:
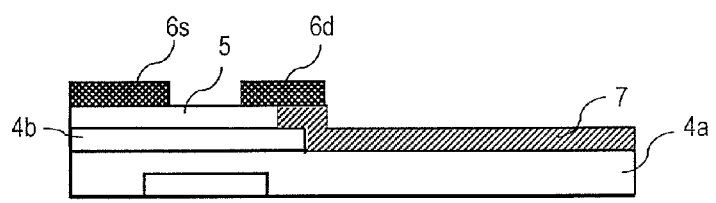

Hereinafter, an exemplary method for fabricating this TFT substrate 100B will be described with reference to FIG. 6. Specifically, FIGS. 6(a) and 6(b) are schematic cross-sectional views illustrating respective manufacturing process steps to fabricate the TFT substrate 100B.

As shown in FIG. 6(a), a gate electrode 3, a lower gate insulating layer 4a and an upper gate insulating layer 4b are formed by known methods on a substrate 2. In this process step, the lower gate insulating layer 4a is made of the material of the reducing insulating layer 8a described above. Also, the upper gate insulating layer 4b is patterned to expose the lower gate insulating layer 4b partially.

Next, an oxide semiconductor film 5' is formed over the upper and lower gate insulating layers 4a, 4b and source and drain electrodes 6s and 6d are formed on the oxide semiconductor film 5' by the methods described above.

As shown in FIG. 6(b), a portion of the oxide semiconductor film 5' which contacts with the lower gate insulating layer 4a has its resistance lowered through the reduction reaction described above to turn into the first transparent electrode 7. On the other hand, the rest of the oxide semiconductor film which has not had its resistance lowered turns into an oxide semiconductor layer 5. The oxide semiconductor layer 5 is formed so as to contact with the upper gate insulating layer 4b.

Subsequently, an insulating protective layer 8b is formed on the first transparent electrode 7 by the method described above so as to contact with the channel region of the oxide semiconductor layer 5, thereby forming a dielectric layer 8. Thereafter, a first transparent electrode 9 is formed on the insulating protective layer 8b to complete the TFT substrate 100B shown in FIG. 5.

Figure 7:
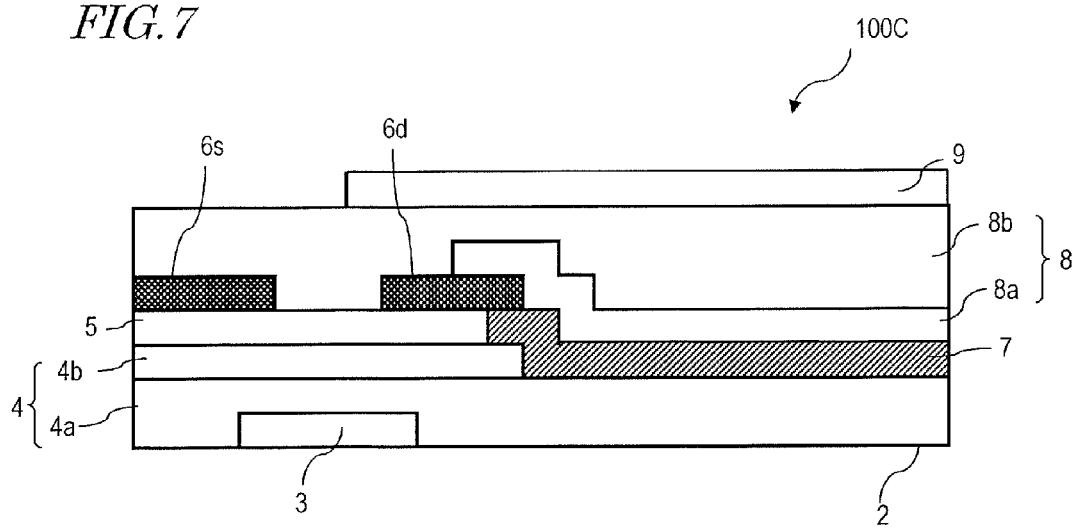
FIG. 7 A schematic cross-sectional view of a TFT substrate 100C according to still another embodiment of the present invention.

Hereinafter, a TFT substrate 100C according to still another embodiment of the present invention will be described with reference to FIG. 7, which is a schematic cross-sectional view of the TFT substrate 100C and which corresponds to FIG. 1(b). In FIG. 7, any component also included in the TFT substrate 100A and having substantially the same function as its counterpart is identified by the same reference numeral and its description will be omitted herein to avoid redundancies.

In the TFT substrate 100C shown in FIG. 7, a reducing insulating layer 8a has been formed on the first transparent electrode 7 of the TFT substrate 100B. Thus, in this TFT substrate 100C, the first transparent electrode 7 contacts with the reducing insulating layer 8a and the lower gate insulating layer 4a which is made of the material of the reducing insulating layer 8a. In this TFT substrate 100C, the dielectric layer 8 includes the reducing insulating layer 8a and an insulating protective layer 8b. Also, in this TFT substrate 100C, the lower gate insulating layer 4a is made of the material of the reducing insulating layer 8a.

Hereinafter, an exemplary method for fabricating this TFT substrate 100C will be described with reference to FIG. 8, which is a schematic cross-sectional view illustrating a manufacturing process step to fabricate the TFT substrate 100C.

A gate electrode 3, a lower gate insulating layer 4a, an upper gate insulating layer 4b, an oxide semiconductor film 5' and source and drain electrodes 6s, 6d are formed as described above on a substrate 2 (see FIGS. 6(a) and 6(b)).

Figure 8:
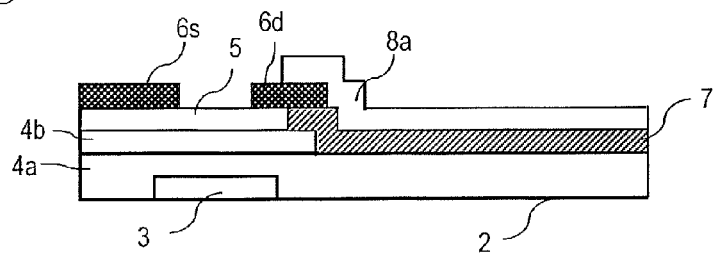
FIG. 8 A schematic cross-sectional view illustrating a manufacturing process step to fabricate the TFT substrate 100C according to the embodiment of the present invention.

Subsequently, as shown in FIG. 8, a reducing insulating layer 4a is formed on the oxide semiconductor film 5' by the method described above. The reducing insulating layer 4a is formed so as not to contact with the channel region of the oxide semiconductor film 5'. Also, when viewed along a normal to the substrate 2, an end portion of the reducing insulating layer 4a preferably overlaps with the drain electrode 6d.

A portion of the oxide semiconductor film 5' which contacts with either the lower gate insulating layer 4a or the reducing insulating layer 4a has its resistance lowered to turn into the first transparent electrode 7. On the other hand, the rest of the oxide semiconductor film 5' which has not had its resistance lowered turns into an oxide semiconductor layer 5.

Subsequently, an insulating protective layer 8b is formed on the reducing insulating layer 8a so as to contact with the channel region of the oxide semiconductor layer 5 and a second transparent electrode 9 is formed on the insulating protective layer 8b as described above to complete the TFT substrate 100C shown in FIG. 7.

Figure 9:
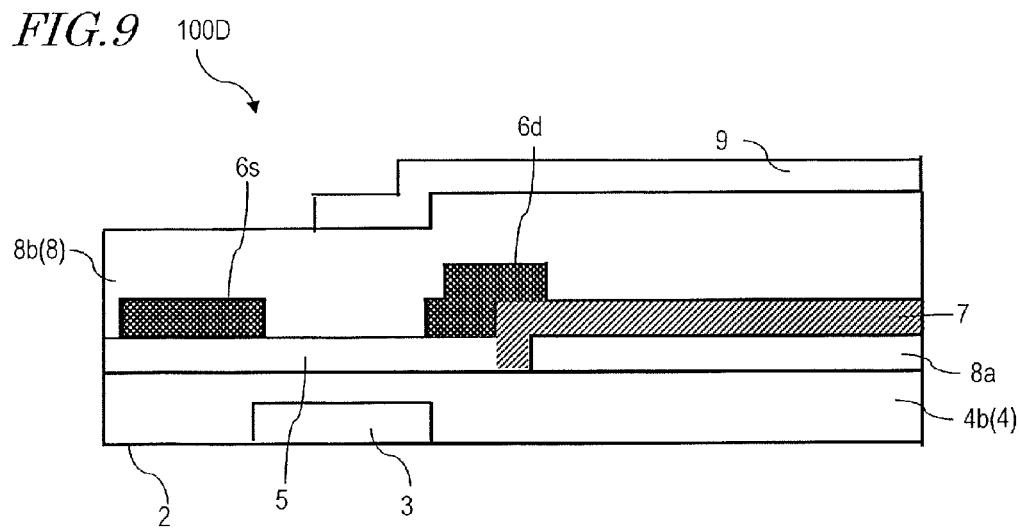
FIG. 9 A schematic cross-sectional view of a TFT substrate 100D according to yet another embodiment of the present invention.

Hereinafter, a TFT substrate 100D according to yet another embodiment of the present invention will be described with reference to FIG. 9, which is a schematic cross-sectional view of the TFT substrate 100D and which corresponds to FIG. 1(b). In FIG. 9, any component also included in the TFT substrate 100A and having substantially the same function as its counterpart is identified by the same reference numeral and its description will be omitted herein to avoid redundancies.

The TFT substrate 100D shown in FIG. 9 includes a gate electrode 3 on a substrate 2, a gate insulating layer 4 which has been formed on the gate electrode 3, a reducing insulating layer 8a and an oxide semiconductor layer 5 which have been formed over the gate insulating layer 4, source and drain electrodes 6s, 6d which have been formed on the oxide semiconductor layer 5, a dielectric layer 8 which has been formed over the source and drain electrodes 6s, 6d, and a second transparent electrode 9 which has been formed on the dielectric layer 8.

In this TFT substrate 100D, the reducing insulating layer 8a has been formed under the first transparent electrode 7. The reducing insulating layer 8a contacts with the first transparent electrode 7 but does not contact with the oxide semiconductor layer 5. The gate insulating layer 4 is made of the material of the upper gate insulating layer 4b described above. The dielectric layer 8 includes the insulating protective layer 8b described above but does not include the reducing insulating layer 8a. In this example, the dielectric layer 8 may include the reducing insulating layer 8a. The gate insulating layer 4 and the insulating protective layer 8b contact with the oxide semiconductor layer 5.

As can be seen from the foregoing description, embodiments of the present invention provide a semiconductor device which can contribute to fabricating a display panel of high display quality with the manufacturing cost cut down and also provide a method for fabricating such a semiconductor device.

INDUSTRIAL APPLICABILITY

The present invention is applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner.

REFERENCE SIGNS LIST 2 substrate
3 gate electrode
4 gate insulating layer
4a lower gate insulating layer
4b upper gate insulating layer
5 oxide semiconductor layer
6s source electrode
6d drain electrode
7 first transparent electrode
8 dielectric layer
8a reducing insulating layer
8b insulating protective layer
9 second transparent electrode
50 liquid crystal layer
100A semiconductor device (TFT substrate)
200 counter substrate
500 liquid crystal display device

The invention claimed is:
1. A semiconductor device comprising:
a substrate;
a gate electrode on the substrate;
a gate insulating layer located over the gate electrode;
an oxide semiconductor layer on the gate insulating layer;
source and drain electrodes electrically connected to the oxide semiconductor layer;
a first transparent electrode electrically connected to the drain electrode, the first transparent electrode being a pixel electrode;
a dielectric layer located over the source and drain electrodes; and
a second transparent electrode on the dielectric layer, wherein
at least a portion of the second transparent electrode overlaps with the first transparent electrode with the dielectric layer interposed between them, a lower surface of the first transparent electrode contacts with a reducing insulating layer which has a property of reducing an oxide semiconductor included in the oxide semiconductor layer, the reducing insulating layer does not contact with a channel region of the oxide semiconductor layer, and the oxide semiconductor layer and the first transparent electrode are made of the same oxide film.

2. The semiconductor device of claim 1, wherein the dielectric layer includes the reducing insulating layer which contacts with the upper surface of the first transparent electrode; and an oxide insulating layer which contacts with the channel region of the oxide semiconductor layer.

3. The semiconductor device of claim 1, wherein the gate insulating layer includes the reducing insulating layer which contacts with the lower surface of the first transparent electrode; and an oxide insulating layer which contacts with a lower surface of the oxide semiconductor layer.

4. The semiconductor device of claim 1, wherein the drain electrode is on the first transparent electrode, and the first transparent electrode contacts directly with the drain electrode.

5. The semiconductor device of claim 1, wherein when viewed along a normal to the substrate, an end portion of the reducing insulating layer overlaps with the drain electrode.

6. The semiconductor device of claim 1, wherein the oxide film includes In, Ga and Zn.

7. The semiconductor device of claim 1, wherein the oxide semiconductor layer includes an In—Ga—Zn—O based semiconductor.

8. The semiconductor device of claim 1, wherein the reducing insulating layer includes an upper reducing insulating layer which contacts with the upper surface of the first transparent electrode and a lower reducing insulating layer which contacts with the lower surface of the first transparent electrode.

9. A method for fabricating the semiconductor device of claim 1, the method comprising the steps of:

(a) providing the substrate;

(b) forming the gate electrode and the gate insulating layer on the substrate;

(c) forming the oxide semiconductor film on the gate insulating layer;

(d) forming the source and drain electrodes on the oxide semiconductor film;

(e) forming the dielectric layer over the source and drain electrodes;

(f1) forming, either before or after the step (c), a reducing insulating layer which contacts with a portion of the oxide semiconductor film and which has a property of reducing an oxide semiconductor included in the oxide semiconductor film; and (f2) after the steps (c) and (f1), forming the first transparent electrode in a portion of the oxide semiconductor film which contacts with the reducing insulating layer and also forming the oxide semiconductor layer in the rest of the oxide semiconductor film which has not been reduced; and (g) forming the second transparent electrode on the dielectric layer, at least a portion of the second transparent electrode overlapping with the first transparent electrode with the dielectric layer interposed between them.

10. The method of claim 9, wherein the reducing insulating layer is a portion of the gate insulating layer, and the step (b) includes the step (f1).

11. The method of claim 9, wherein the reducing insulating layer is a portion of the dielectric layer, and the step (e) includes the step (f1).

12. The method of claim 9, wherein at least one of the dielectric layer and the gate insulating layer includes an oxide insulating layer, and the oxide insulating layer contacts with the oxide semiconductor layer.

13. The method of claim 9, wherein when viewed along a normal to the substrate, an end portion of the reducing insulating layer overlaps with the drain electrode.

14. The method of claim 9, wherein the oxide semiconductor film includes an In—Ga—Zn—O based semiconductor.

* * * * *